United States Patent [19]

Mori et al.

[11] Patent Number: 5,404,125

[45] Date of Patent: Apr. 4, 1995

[54] INFRARED RADIATION SENSOR

[75] Inventors: Takehisa Mori; Kiyoshi Komatsu, both of Nakai, Japan

[73] Assignee: Terumo Kabushiki Kaisha, Tokyo, Japan

[21] Appl. No.: 916,192

[22] Filed: Jul. 17, 1992

[30] Foreign Application Priority Data

Jul. 19, 1991 [JP] Japan .................. 3-179525

[51] Int. Cl.⁶ ............................. H01L 31/08
[52] U.S. Cl. .................... 338/18; 250/338.1; 250/345
[58] Field of Search ............... 338/18, 25, 22 R, 306, 338/307, 308, 309; 250/338.1, 345, 338.4

[56] References Cited

U.S. PATENT DOCUMENTS

| | | | |
|---|---|---|---|
| 3,911,277 | 10/1975 | Ceckerstrand et al. | 250/345 |
| 4,647,777 | 3/1987 | Meyer | 250/345 X |
| 4,754,263 | 3/1986 | Liddiard | 338/18 |
| 5,118,944 | 6/1992 | Mori et al. | |
| 5,189,500 | 2/1993 | Kusunoki | 338/18 X |
| 5,220,188 | 6/1993 | Higashi et al. | 338/18 X |

FOREIGN PATENT DOCUMENTS

| | | |
|---|---|---|
| 0360286 | 3/1990 | European Pat. Off. . |
| 0453372 | 10/1991 | European Pat. Off. . |
| 3902628 | 8/1990 | Germany . |
| 56-164582 | 12/1981 | Japan . |
| 57-98824 | 6/1982 | Japan . |
| 60-80281 | 5/1985 | Japan . |
| 60-97676 | 5/1985 | Japan . |
| 60-97677 | 5/1985 | Japan . |
| 63-273024 | 11/1988 | Japan . |
| 2-138841 | 5/1990 | Japan . |
| 2-237166 | 9/1990 | Japan . |
| 2-240971 | 9/1990 | Japan . |
| 2021864 | 12/1979 | United Kingdom . |
| WO82/01066 | 4/1982 | WIPO . |

OTHER PUBLICATIONS

Patent Abstracts of Japan, vol. 6, No. 188 (P-144) (1066) 28 Sep. 1982, of JP-A-57 98 824, Jun. 1982.
Patent Abstracts of Japan, vol. 13, No. 91, (P-837), 3 Mar. 1989, of JP-A-63 273 024, Nov. 10, 1988.

Primary Examiner—Marvin M. Lateef
Attorney, Agent, or Firm—Frishauf, Holtz, Goodman & Woodward

[57] ABSTRACT

An infrared sensor comprising a sensor substrate formed of a semiconducting material and at least one set of infrared sensing portions formed one each on the opposite surfaces of said sensor substrate, wherein said infrared sensing portions are superposed one each on bride portions formed on cavities formed one each on the opposite surfaces of said sensor substrate.

14 Claims, 4 Drawing Sheets

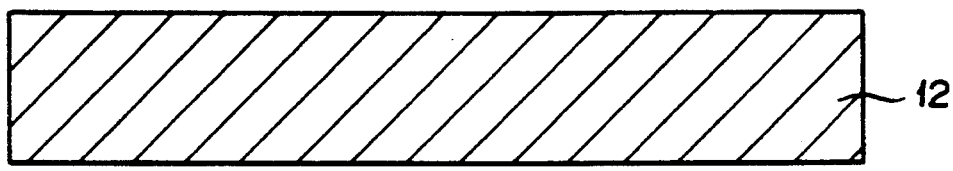
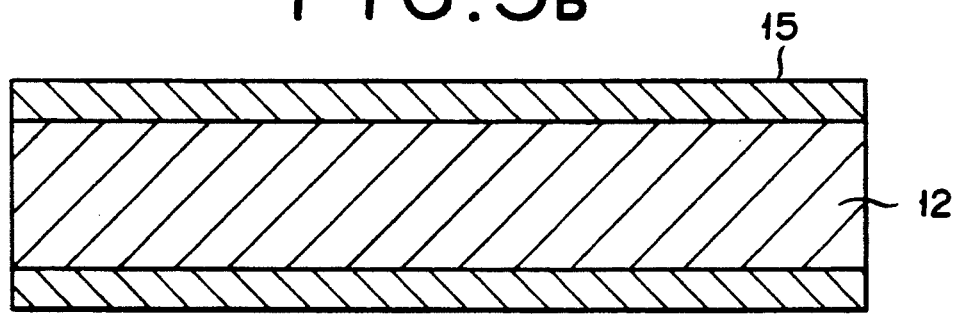
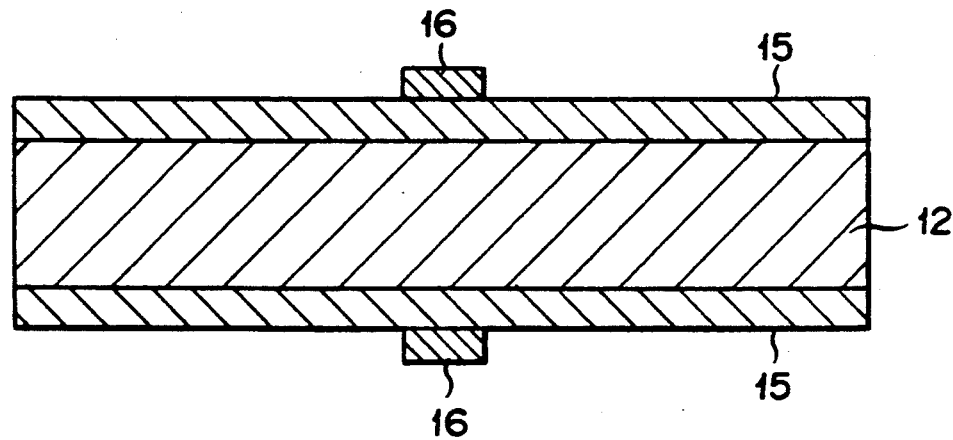

INFRARED RADIATION SENSOR

BACKGROUND OF THE INVENTION

1. Field of the Invention

This invention relates to an infrared radiation sensor for noncontact measurement of the temperature of an object under test such as tymponic membrane, and a method for the production thereof.

2. Description of the Prior Art

Recently, various techniques have-been developed for the production of infrared radiation sensors advantageously used such as for noncontact type thermometers by using the technique for fine processing of semiconductors. The infrared sensor has a construction completed by forming a micro bridge portion formed on a sensor substrate and further forming an infrared radiation sensing portion on the bridge portion. The bridge structure which has the thermosensitive portion of device suspended is after the fashion of a bridge above the supporting substrate is intended to improve the sensitivity of response of the device.

The infrared radiation sensing portions which are used in the infrared sensors may be classified into those of the bolometer type having the resistance of a device varied proportionately to a change caused in the sensor temperature by infrared radiation, those of the thermopile type having the electromotive force of a device varied similarly, and those of the pyroelectric type having the electromotive force of a device varied proportionately to a change in the dose of infrared radiation. The infrared radiation sensing portions of the bolometer type, among other types, allow miniaturization of their sensors as because they are capable of directly indicating temperature from the magnitude of resistance. The infrared radiation sensor of the bolometer type is generally provided with at least two infrared radiation sensing portions, one of which is adapted to admit infrared radiation and the other shielded from infrared radiation. By deriving a differential output between the infrared sensing portion admitting the infrared radiation and the infrared radiation sensing portion repelling the infrared radiation, this sensor is enabled to detect accurately the net dose of infrared radiation free from electrical noise and thermal disturbance.

Incidentally, the conventional infrared radiation sensor has these at least two infrared sensing portions formed on only one of the opposite surfaces of a semiconductor wafer or substrate which serves as the sensor substrate.

Since the conventional infrared radiation sensor has at least two infrared sensing portions formed only on one of the opposite surfaces of the sensor substrate, it is difficult to allow the infrared radiation to impinge solely on one of the infrared sensing portions and prevent it from impinging on the other infrared radiation sensing portion. From the differential outputs of these two infrared radiation sensing portions, therefore, the net dose of impinging infrared radiation cannot be accurately detected. The data of determination consequently obtained must be subjected to various corrections. Further, the conventional infrared radiation sensor has a limit to the overall miniaturization thereof because of the fact that two or more infrared radiation sensing portions are formed on one and the same surface of the sensor substrate, coupled with the problem of shielding against the infrared radiation.

An object of this invention therefore, is to provide a novel infrared radiation sensor and a method for the production thereof.

Another object of this invention is to provide an infrared radiation sensor which allows generous overall miniaturization thereof, enables the infrared radiation to impinge infallibly on a specific infrared radiation sensing portion exclusively, and warrants accurate detection of the dose of infrared radiation and a method for the production of the infrared radiation sensor.

SUMMARY OF THE INVENTION

These objects are accomplished by an infrared radiation sensor which is provided with a sensor substrate formed of a semiconducting material and at least one set of infrared radiation sensing portions formed one each on the opposite surfaces of the sensor substrate.

These objects are further accomplished by a method for the production of an radiation, infrared sensor, comprising a step of advancing a reactive gas into contact with a semiconductor substrate thereby depositing an inorganic silicon compound film on each of the opposite surfaces of the semiconductor substrate, a step of subjecting the inorganic silicon compound film to a patterning treatment, a step of superposing an infrared radiation sensing portion on each of the patterned inorganic silicon compound films, and a step of removing the semiconductor underlying each of the patterned inorganic silicon compound films thereby forming cavities beneath the films and consequently forming bridge portions of the inorganic silicon compound film one each on the opposite surfaces of the semiconductor substrate.

The infrared radiation sensor of this invention allows generous miniaturization of itself specifically to one half the size of the conventional countertype and enables the differential output between the two infrared sensing portions on the opposite surfaces thereof to be detected accurately and enjoys an effect in improving the accuracy of determination because it is so constructed as to have infrared radiation sensing films formed one each on the opposite surfaces of a semiconductor substrate. It is, therefore, used advantageously as a veritably miniature sensor such as, for example, a thermometer adapted to measure the body temperature of a user by having a sensor portion thereof inserted in the ear. In the infrared sensor of this invention, the bridge portions on the opposite surfaces of the semiconductor substrate are improved in stress balance and stabilized in structure because they are formed of a film of an inorganic silicon compound, particularly a film of silicon oxynitride. Further, the infrared radiation sensor of this invention is enabled to acquire ample strength and ideal sensitivity because the film of an inorganic silicon compound, particularly silicon oxynitride, is given a wall thickness in the range between about 0.1 and about 50 μm. The method of this invention for the production of an infrared radiation sensor produces an effect of notably improving the yield of products because the bridge portions are formed of a film of an inorganic silicon compound, particularly silicon oxynitride.

BRIEF DESCRIPTION OF THE DRAWINGS

FIGS. 3A to 3G are cross sections jointly illustrating a process for the production of the infrared sensor of FIG. 1.

DESCRIPTION OF THE PREFERRED EMBODIMENT

Figure 1:
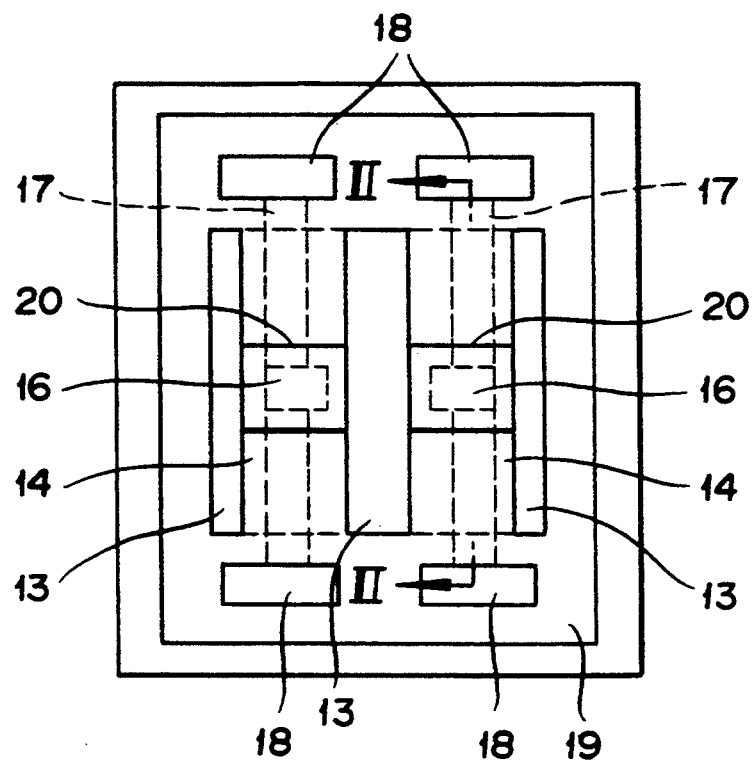
FIG. 1 is a plan view illustrating an radiation infrared sensor as one embodiment of this invention.

The infrared radiation sensor of this invention has infrared radiation sensing portions formed one each on the opposite surfaces of a sensor substrate. Owing to this construction, the total surface area of the sensor may be one half that of the conventional sensor in spite of the sameness of number of infrared sensing portions and the sensor is allowed a generous reduction in size. Further, since the infrared sensing portions are distributed between the opposite surfaces of the sensor substrate, the sensor substrate which intervenes between the infrared radiation sensing portions fulfills the role of an infrared radiation intercepting member and renders it easy to limit the selective impingement of infrared radiation only to the infrared radiation sensing portion on one of the opposite surfaces. Owing to the superposition of infrared radiation absorbing films one each on the infrared radiation sensing portions, the infrared radiation sensing films are improved in efficiency of absorption and in accuracy of infrared radiation detection. The infrared radiation absorbing films are made of gold black or carbon, for example, and are desired to have a thickness in the range between about 0.3 and about 10 μm, preferably between 0.3 and 2 μm.

As the sensor substrate, a semiconductor substrate made of silicon or germanium may be used. Preferably, a silicon substrate which can be procured easily and inexpensively is used. The infrared radiation sensing portions are formed of a film of amorphous germanium (a-Ge), amorphous silicon (a-Si), or polycrystalline silicon, for example. For the formation of the films for the infrared sensing portions, spattering, ion beam spattering, or CVD (chemical vapor-phase growth) method may be used, for example.

The infrared radiation sensor of this invention is preferable to be produced by a procedure which comprises forming bridge portions (bridges) one each on the opposite surfaces of the sensor substrate and superposing the infrared sensing portions one each on the bridge portions. The bridge portions may be formed of a film of an inorganic silicon compound such as, for example, silicon oxide ($SiO_x$) film, silicon nitride ($SiN_y$) film, or silicone oxynitride ($SiO_xN_y$) film, for example. Preferably, they are formed of a silicon oxynitride film. The silicon oxynitride film combines the qualities of both the silicon oxide film and silicon nitride film. It, therefore, excels in stress balance and permits formation of stable bridge structures. The optimum conditions for the formation of the silicon oxynitride film vary with the particular kind of the sensor substrate to be used because the thermal expansion coefficient of the film varies with the orientation of the crystal surface of the material for the substrate.

The thickness of the silicon oxynitride film is preferable to be in the range between 0.1 and 50 μm, preferably between about 0.5 and about 5 μm. If the thickness is less than 0.1 μm, the film is too thin to acquire ample strength. Conversely, if the thickness exceeds 50 μm, the film acquires a large thermal capacity and consequently suffers from deficiency in sensitivity.

The method of this invention for the production of a balometer type infrared radiation sensor comprises a step of advancing a reactive gas into contact with a semiconductor substrate thereby forming inorganic silicon compound films one each on the opposite surfaces of the semiconductor substrate, a step of subjecting the inorganic silicon compound films formed on the opposite surfaces of the semiconductor substrate to a patterning treatment, a step of superposing infrared radiation sensing portions one each on the patterned inorganic silicon compound films, and a step of selectively removing the semiconductor substrates underlying the patterned inorganic silicon compound films thereby forming cavities beneath the films and consequently forming bridge portions of inorganic silicon compound film one each on the opposite surfaces of the semiconductor substrate.

The formation of the inorganic silicon compound films is specifically carried out by the plasma CVD method, for example. In the formation of silicon oxynitride films, monosilane ($SiH_4$), nitrogen ($N_2$), and laughing gas ($N_2O$) are used as reactive gases. Here, by varying the flow volume ratio of the $N_2$ and $N_2O$ gases [$N_2/(N_2+N_2O)$], the stoichiometric compositions x and y of the silicon oxynitride film ($SiO_xN_y$) can be controlled, the difference in thermal expansion coefficient between the film and the silicon substrate can be substantially eliminated, and the possible damage by stress can be precluded.

The method employed for the formation of the silicon oxynitride film needs not be limited to the plasma CVD method. Some other method such as, for example, a spattering method may be used instead. By this spattering low pressure CVD method and method, it suffices to form the silicon oxynitride film by using silicon oxide as a target. In this case, the composition of the silicon oxynitride film can be varied by incorporating nitrogen ($N_2$) into the spattering gas such as, for example, argon (Ar).

The patterning on the inorganic silicon compound films is carried out by the reactive ion etching method, for example. The superposition of the infrared sensing portions on the patterned inorganic silicon compound films is carried out by the spattering method, ion beam spattering method, or CVD method using amorphous germanium, amorphous silicon, or polycrystalline silicon, for example.

The formation of the bridge portions is effected by selectively removing by etching the sensor substrate underlying the patterned inorganic silicon compound films with an aqueous solution of hydrazine, potassium hydroxide, etc., for example, thereby forming cavities beneath the films.

Now, one embodiment of this invention will be specifically described below with reference to the accompanying drawings.

Figure 2:
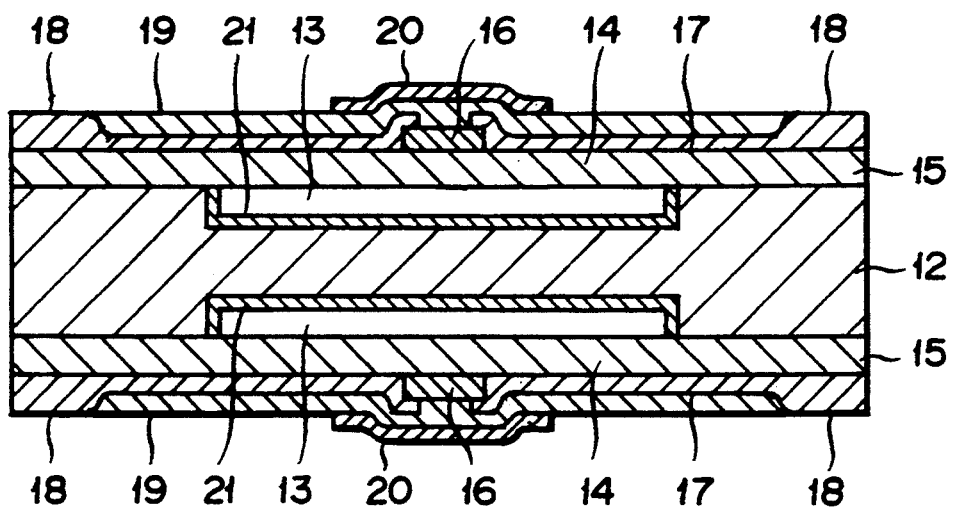
FIG. 2 is a cross section taken through FIG. 1 along the line II—II.

FIG. 1 represents a plan structure of an infrared radiation sensor 11 as one embodiment of this invention and FIG. 2 is a cross section taken through FIG. 1 along the line II-II.

In this infrared radiation sensor 11, cavities 13 are formed one each on the opposite surfaces of a silicon substrate 12 as the sensor substrate. Further, on the opposite surfaces of the silicon substrate 12, inorganic silicon compound films such as, for example, silicon oxynitride films 15 severally provided with bridge portions 14 measuring 100 μm in width, 2 mm in length, and 2 μm in thickness are formed one each on the cavities 13. Infrared radiation sensing portions 16 are formed in the upper central portions of the bridge portions 14. These infrared radiation sensing portions 16 are formed of amorphous germanium (a-Ge), for example. To the infrared sensing portions 16 are electlrically connected one-terminal portions of electrode connecting layers 17. The connecting layers 17 are formed of an aluminum (Al) film. The other-terminal portions of these connecting layers 17 are integrated with electrode pads 18 which are formed in the peripheral portion of the silicon substrate 12. On the connecting layers 17, inorganic silicon compound films such as, for example, silicon oxynitride films 19 are superposed as insulating films. On the silicon oxynitride films 19, infrared radiation absorbing films 20 having a thickness of about 0.5 μm are formed so as to cover the infrared sensing portions 16. These infrared absorbing films 20 are intended to heighten the infrared radiation sensing portions 16 in efficiency of absorption of infrared radiation. They are formed of gold black or nichrome, for example. The intercepting member 21 such as Ni is formed on the cavity 13 so that the infrared radiation from the surface of the substrate is sufficiently intercepted.

In this infrared radiation sensor 11, the magnitude of electric resistance of the infrared radiation sensing portions 16 is varied proportionately to the amount of impinging infrared radiation (heat quantity). The amount of infrared radiation can be detected by measuring the magnitude of electric current flowing through the electrode connecting layers 17 proportionately to the change in the magnitude of resistance or the magnitude of voltage between the electrode pads 18 by means of a signal processing circuit (not shown). In the infrared radiation sensor 11 of this embodiment, since the infrared radiation sensing portions 16 are distributed between the opposite surfaces of the silicon substrate 12, infrared radiation can be sufficienly intercepted by an infrared-intercepting member 21 made of, e.g., nickel and renders it easy to limit selective impingement of infrared radiation to the infrared radiation sensing portion 16 on one of the opposite surfaces. When the infrared radiation is allowed to impinge only on the two infrared sensing films 16 on the upper surface, the radiation infrared radiation is not impinged in to the two infrared radiation sensing portions 16 on the reverse surface of the silicon substrate 12, because it is sufficiently intercepted by the intercepting member 21 made of, e.g., nickel. As a result, the differential output between the infrared radiation sensing portion 16 admitting the impingement of infrared radiation and the infrared radiation sensing portion 16 repelling the infrared radiation can be accurately obtained. Thus, the infrared radiation sensor performs the determination with enhanced accuracy.

Further, owing to the superposition of the radiation infrared sensing portions 16 on the opposite surfaces of the silicon substrate 12, the total surface area of the sensor may be one half that of the conventional sensor in spite of the sameness of number of infrared radiation sensing portions 16 and the infrared radiation sensor allows a generous reduction in size.

In the infrared radiation sensor 11 of this embodiment, since the bridge portions 14 on the opposite surfaces are formed of a single-layer silicon oxynitride film 15 excelling in stress balance, the possible difference in thermal expansion coefficient between the film and the silicon substrate 12 can be substantially eliminated. As a result, the bridge structures are so stable that the possibility of the structures sustaining damage during the process of production is nil.

Figure 3D:
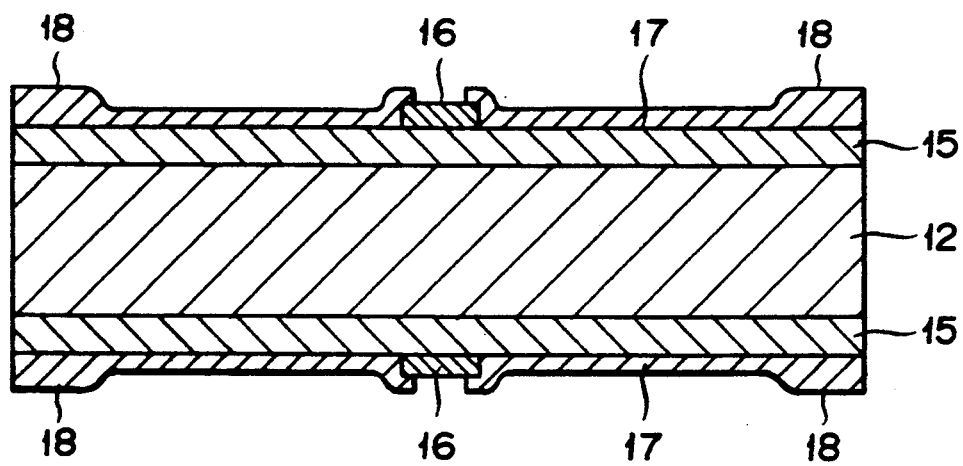

FIGS. 3A to 3G jointly represent a process of production of the infrared radiation sensor 11. First, a silicon substrate 12 having a crystal face orientation (110) as illustrated in FIG. 3A was prepared. Then, silicon oxynitride films ($SiO_xN_y$) 15 were formed one each in a thickness of 2 μm on the opposite surfaces of the silicon substrate 12 by the plasma CVD method as illustrated in FIG. 3B. To be specific, the silicon substrate 12 was kept heated at 450° C. and, under the film-forming conditions of 0.45 Torr of pressure and 400 W of high-frequency output, the hot silicon substrate 12 was swept with reactive gases, i.e. monosilane ($SiH_4$) fed at 15 SCCM, nitrogen ($N_2$) at 203 SCCM, and laughing gas ($N_2O$) at 32 SCCM, for 20 minutes to induce vapor-phase growth of silicon oxynitride films on the opposite surfaces of the silicon substrate 12.

The silicon oxynitride films 15, on analysis by the Rutherford backscattering spectrometric method (RBS method), was found to have a composition of $SiO_{1.20}N_{0.677}$. Then, the silicon oxynitride films 15 were subjected to a patterning treatment to pattern the bridge portions 14 in a crystal orientation of 110 as illustrated in the plan structure of FIG. 1. This patterning was carried out by the reactive ion etching (RIE) method until the underlying silicon substrate 12 was exposed. In this etching, methane trifluoride ($CHF_3$) and oxygen ($O_2$) were fed as etching gases at respective flow volumes of 47.5 SCCM and 2.5 SCCM under a pressure of 0.075 Torr at a high-frequency output of 150 W for three hours.

Subsequently, infrared sensing portions 16 were formed one each in the central portions of the bridge portions 14 on the opposite surfaces as illustrated in FIG. 3C. To be specific, amorphous germanium (a-Ge) films were superposed on the silicon oxynitride films 15 and silicon substrate 12 by subjecting the films 15 and substrate 12 to a spattering treatment using germanium (Ge) as a target. This spattering was carried out by feeding argon (Ar) at flow volumes of 4 SCCM under a pressure of $5 \times 10^{-3}$ Torr at a high-frequency pressure of 200 W for 10 minutes. Then, the superposed amorphous germanium films were subjected to an annealing treatment at 500° C. to accelerate polycrystallization of the amorphous germanium. The resultant polycrystallized amorphous germanium films were patterned by a reactive ion etching treatment.

By the vacuum deposition method at 150° C., aluminum films were deposited one each in a thickness of 0.5 μm on the opposite surfaces of the silicon substrate 12. The aluminum films were subjected to a patterning treatment to form electrode connecting layers 17 and electrode pad portions 18 as illustrated in FIG. 3D.

Figure 3E:
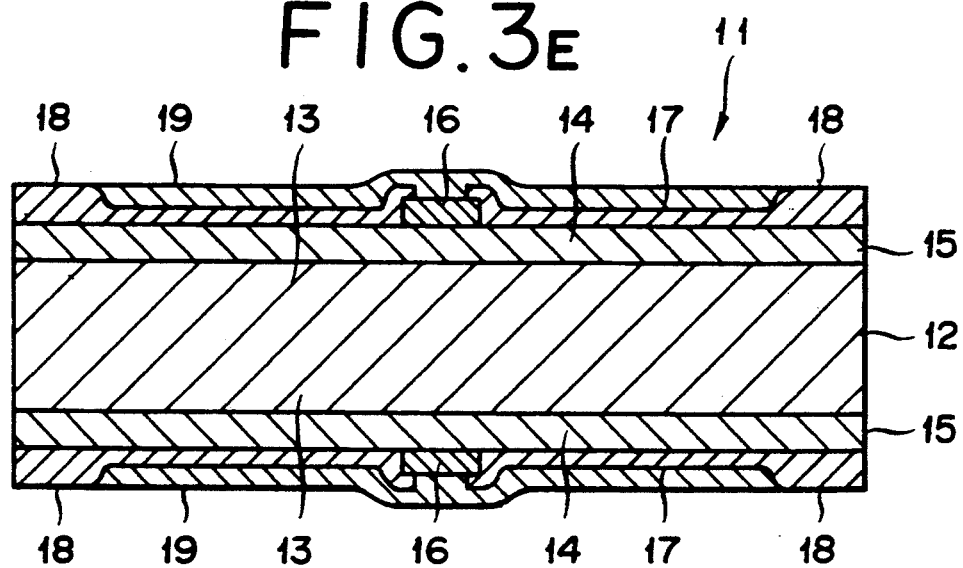
Figure 3F:
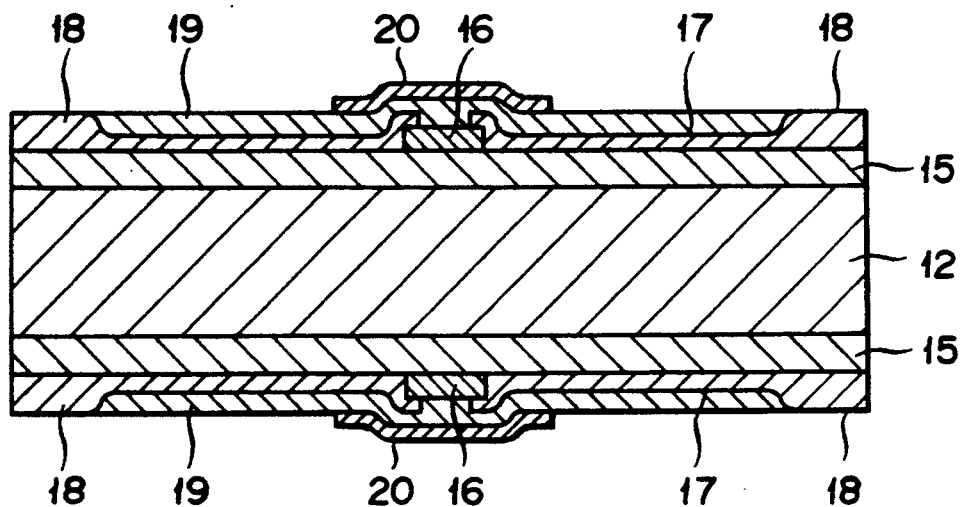

Subsequently, insulating films such as, for example, silicon oxynitride films 19, were formed one each in a thickness of 1 μm on the opposite surfaces of the silicon substrate 12 except for the regions of the electrode pad portions 18 as illustrated in FIG. 3E. The formation of these films was performed under the same conditions as those used in the step of FIG. 3B for 10 minutes. Then, radiation infrared absorbing films 20 were formed one each in a thickness of 0.5 μm on the silicon oxynitride films 19 by the liftoff method as illustrated in FIG. 3F. To be specific, the infrared radiation absorbing films 20 were selectively formed by coating the silicon oxynitride films 19 each with a positive resist film, patterning the positive resist films, vacuum depositing gold black thereon under a pressure of 0.2 Torr, and thereafter removing the positive resist films in conjunction with unnecessary portion of gold black.

Figure 3G:
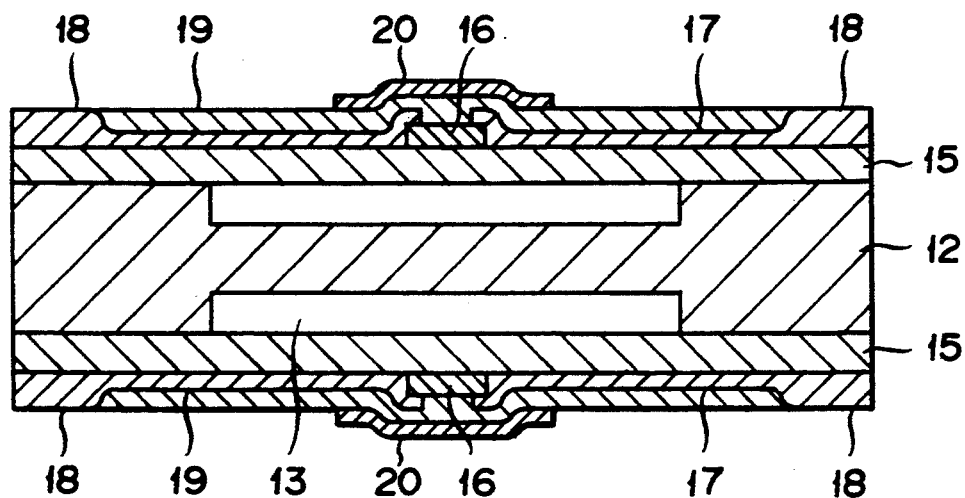

Further, the silicon substrate 12 underlying the bridge portions on the opposite surfaces was selectively removed by etching to form cavities 13 as illustrated in FIG. 3G. This removal was effected by the anisotropic etching method using an aqueous hydrazine solution. Optionally, an aqueous potassium hydroxide solution may be used for this anisotropic etching method. Finally, the surface of the silicon substrate is selectively plated with a nickel film in a thickness of 0.5 μm at the cavities 13 by monelectrolytic plating to form infrared-intercepting film 21 and an infrared radiation sensor having a cross section as shown in FIG. 2.

By the procedure described above, there was produced an infrared radiation sensor which was provided on each of the opposite surfaces thereof with a bridge portions 14 formed of a silicon oxynitride film and an infrared radiation sensing portion 16.

This invention has been described with reference to a working example. This invention needs not be limited to this working example but may be altered in various respects without departing from the spirit of this invention. For example, in the working example, the bridge portions 14 were formed in a linear shape and constructed to be supported at two points. Optionally, they may be constructed to be supported at three points for the purpose of further enhancing strength. While the bridge portions 14 were formed in a flat shape along the surface of the silicon substrate 11 in the working example, they may be formed in an arouate shape. While the bridge portions 14 were formed each with a silicon oxynitride film in the working example, they may be formed with a silicon oxide film or silicon nitride film. Further in the working example, the bridge portions 14 were formed by the excavating method resorting to the anisotropic etching technique. Optionally, they may be formed by some other method such as, for example, the so-called sacrifice layer method which requires the bridge portions 14 to be underlain preparatorily by an etching layer.

What is claimed is:

1. An infrared radiation sensor comprising (i) a sensor substrate having opposite surfaces, said sensor substrate being formed of a semiconducting material, and (ii) at least one set of infrared radiation sensing portions formed on each of the opposite surfaces of said sensor substrate.

2. The infrared radiation sensor according to claim 1, which further comprises at least one set of bridge portions on which each of said infrared radiation sensing portions are disposed thereon, said bridge portions each being disposed on a least one set of cavities which are formed on each of the opposite surfaces of said sensor substrate.

3. The infrared radiation sensor according to claim 2, wherein each of said infrared radiation sensing portions are coated with an infrared radiation absorbing film.

4. The infrared radiation sensor according to claim 2, wherein each of said bridge portions are formed of a film of an inorganic silicon compound.

5. The infrared radiation sensor according to claim 4, wherein said inorganic silicon compound is at least one compound selected from the group consisting of silicon oxide, silicon nitride, and silicon oxynitride.

6. The infrared radiation sensor according to claim 4, wherein said inorganic silicon compound is silicon oxynitride.

7. The infrared radiation sensor according to claim 4, wherein said inorganic silicon compound film has a thickness of 0.1 and 5 μm.

8. The infrared radiation sensor according to claim 1, wherein each of said infrared radiation sensing portions are formed of at least one member selected from the group consisting of amorphous germanium, amorphous silicon, and polycrystalline silicon.

9. The infrared radiation sensor according to claim 3, wherein each of said infrared radiation absorbing films are formed of gold black or carbon.

10. The infrared radiation sensor according to claim 3, wherein the infrared absorbing film has a thickness of 0.3 to 10 μm.

11. The infrared radiation sensor according to claim 3, wherein the infrared absorbing film has a thickness of 0.3 to 2 μm.

12. The infrared radiation sensor according to claim 2, wherein the sensor substrate is formed from silicon or germanium.

13. The infrared radiation sensor according to claim 4, wherein said inorganic silicon film has a thickness of 0.1 to 5 μm; said infrared sensing portions are formed of a material selected from the group consisting of amorphous germanium, amorphous silicon and polycrystalline silicon; said infrared sensing portions being coated with an infrared radiation absorbing film formed of a material selected from the group consisting of gold black and carbon and having a thickness of 0.3 to 2 μm.

14. The infrared radiation sensor according to claim 1, wherein for said at least one set of infrared radiation sensing portions, each of said infrared radiation sensing portions oppose each other and are longitudinally aligned with each other.

* * * * *

UNITED STATES PATENT AND TRADEMARK OFFICE
CERTIFICATE OF CORRECTION

PATENT NO. : 5,404,125
DATED : April 4, 1995
INVENTOR(S) : MORI et al

It is certified that error appears in the above-indentified patent and that said Letters Patent is hereby corrected as shown below:

Title Page, Right Column, OTHER PUBLICATIONS, after "Mar. 1989, of JP-A-63 273 024, Nov. 10, 1988.", insert --Article entitled "A NOVEL FOUR ELECTRODE ELECTROCHEMICAL ETCH-STOP METHOD FOR SILICON MEMBRANE FORMATION" by Kloeck et al published TRANSDUCERS '87 pp. 116-119, 1987

Article entitled "THE MECHANISM OF ANISOTROPIC SILICON ETCHING AND ITS RELEVANCE FOR MICROMACHINING" By H. Seidel, published TRANSDUCERS '87 pp. 120-125, 1987

Research paper of Tohoku Branch Meeting of the Electricity Releated Society of Japan (Shoji et al), published in 1988 entitled FUNDAMENTAL RESEARCH RELATING TO FORMATION OF THIN DIAPHRAGM BY HIGH DENSITY DIFFUSION USING BOROFILM Research paper of Tokoku-gakuin University (M. Kimura), Vol.20 No. 2 (May 1986), entitled MICRO-AIR-BRIDGE AND SENSORS--.

UNITED STATES PATENT AND TRADEMARK OFFICE
CERTIFICATE OF CORRECTION

PATENT NO. : 5,404,125
DATED : April 4, 1995
INVENTOR(S) : MORI et al

It is certified that error appears in the above-indentified patent and that said Letters Patent is hereby corrected as shown below:

Title Page, Right Column, [57] ABSTRACT, delete in entirety and replace with --An infrared radiation sensor including (i) a sensor substract having opposite surfaces and formed of a semiconducting material, and (ii) at least one set of infrared sensing portions formed on opposite surfaces of the sensor substrate. The infrared radiation sensing portions are superposed on bridge portions which are formed on cavities, the cavities being formed on the opposite surfaces of the sensor substrate.--.

Column 2, line 19, delete "radiation, infrared" and insert --infrared radiation--.

Column 6, line 61, delete "radiation infrared" and insert --infrared radiation--.

Signed and Sealed this

Seventeenth Day of September, 1996

Attest:

BRUCE LEHMAN

*Attesting Officer*    *Commissioner of Patents and Trademarks*